(12) United States Patent
Ko et al.

(10) Patent No.: US 12,237,296 B2
(45) Date of Patent: Feb. 25, 2025

(54) SYSTEM FOR LASER BONDING OF FLIP CHIP

(71) Applicant: PROTEC CO., LTD., Gyeonggi-do (KR)

(72) Inventors: Youn Sung Ko, Chungcheongnam-do (KR); Geunsik Ahn, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 762 days.

(21) Appl. No.: 17/516,620

(22) Filed: Nov. 1, 2021

(65) Prior Publication Data

US 2022/0052019 A1 Feb. 17, 2022

Related U.S. Application Data

(63) Continuation of application No. PCT/KR2019/006792, filed on Jun. 5, 2019.

(30) Foreign Application Priority Data

May 3, 2019 (KR) .................. 10-2019-0052270

(51) Int. Cl.
*H01L 23/00* (2006.01)
*B23K 1/005* (2006.01)
(Continued)

(52) U.S. Cl.
CPC ............ *H01L 24/75* (2013.01); *B23K 1/0056* (2013.01); *B23K 26/032* (2013.01); *B23K 26/034* (2013.01); *B23K 26/0626* (2013.01); *B23K 26/18* (2013.01); *B23K 26/324* (2013.01); *B23K 37/0435* (2013.01); *H01L 21/56* (2013.01); *H01L 21/67* (2013.01); *H01L 21/67276* (2013.01); *H01S 3/101* (2013.01); *B23K 26/0869* (2013.01); *B23K 2101/40* (2018.08);
(Continued)

(58) Field of Classification Search
CPC .......... H01L 2224/131; H01L 2224/97; H01L 2224/81; H01L 2924/014; H01L 2924/00014; H01L 24/75; B23K 1/0056; B23K 26/034; B23K 26/032; B23K 26/0626; B23K 26/0622; B23K 26/20
See application file for complete search history.

(56) References Cited

U.S. PATENT DOCUMENTS 9,508,572 B2 11/2016 Yasuyoshi
10,483,228 B2 11/2019 Ahn
(Continued)

FOREIGN PATENT DOCUMENTS

JP  H05335377  12/1993
JP  2000040712  2/2000
JP  2000225480  8/2000

*Primary Examiner* — Jay C Kim
*Assistant Examiner* — Jacob T Nelson
(74) *Attorney, Agent, or Firm* — JCIPRNET

(57) ABSTRACT

A system for laser bonding of flip chip, and more particularly, to a system for laser bonding of flip chip for bonding a flip chip-type semiconductor chip to a substrate by using a laser beam is provided. According to the system for laser bonding of flip chip of the present disclosure, by performing laser bonding on a substrate while pressurizing semiconductor chips, even semiconductor chips which are bent or likely to bend may be bonded to the substrate without causing poor contact of solder bumps.

15 Claims, 4 Drawing Sheets

(51) Int. Cl.
  *B23K 26/03* (2006.01)
  *B23K 26/06* (2014.01)
  *B23K 26/18* (2006.01)
  *B23K 26/324* (2014.01)
  *B23K 37/04* (2006.01)
  *H01L 21/56* (2006.01)
  *H01L 21/67* (2006.01)
  *H01S 3/101* (2006.01)
  *B23K 26/08* (2014.01)
  *B23K 101/40* (2006.01)
  *B23K 103/00* (2006.01)

(52) U.S. Cl.
  CPC .............. *B23K 2103/56* (2018.08); *H01L 2224/75263* (2013.01); *H01L 2224/75704* (2013.01); *H01L 2224/75901* (2013.01)

(56) References Cited

U.S. PATENT DOCUMENTS

| | | |
|---|---|---|
| 2009/0127315 A1 | 5/2009 | Okita |
| 2013/0340943 A1 | 12/2013 | Yoshida et al. |
| 2018/0366433 A1* | 12/2018 | Ahn .................. H01L 25/50 |
| 2018/0366435 A1* | 12/2018 | Ahn .................. B23K 1/0056 |

\* cited by examiner

SYSTEM FOR LASER BONDING OF FLIP CHIP

CROSS-REFERENCE TO RELATED APPLICATION

This application is a continuation of PCT International Application No. PCT/KR2019/006792, filed on Jun. 5, 2019, which claims priority under 35 U.S.C § 119(a) to Korean Patent Application No. 10-2019-0052270, filed on May 3, 2019. The entirety of each of the above-mentioned patent applications is hereby incorporated by reference herein and made a part of this specification.

BACKGROUND

1. Field

One or more embodiments relate to a system for laser bonding of flip chip, and more particularly, to a system for laser bonding of flip chip for bonding a flip chip-type semiconductor chip to a substrate by using a laser beam.

2. Description of the Related Art

As electronic products are becoming compact, a flip chip-type semiconductor chip in which no wire bonding is used is widely used. A plurality of electrodes in the form of solder bumps are formed on a lower surface of a semiconductor chip in the form of a flip chip, and the semiconductor chip is mounted on a substrate by bonding the electrodes to locations of corresponding solder bumps which are also formed on the substrate.

Examples of a method of mounting a semiconductor chip on a substrate by a flip chip method as described above include a reflow method and a laser bonding method. In the reflow method, a semiconductor chip is bonded to a substrate after disposing the semiconductor chip having solder bumps coated with a flux, on the substrate, and passing the semiconductor chip through a high-temperature reflow. According to the laser bonding method, a semiconductor chip including solder bumps coated with a flux is arranged on a substrate like in the reflow method, and the semiconductor chip is irradiated with a laser beam to transfer energy to the semiconductor chip such that the solder bumps are instantaneously melted and then hardened to thereby bond the semiconductor chip to the substrate.

Flip chip-type semiconductor chips that have recently been in use are decreasing in thickness to several tens of micrometers or less. A semiconductor chip having such a small thickness may be slightly bent or warped due to an internal stress of the semiconductor chip itself. When a semiconductor chip is deformed as above, the semiconductor chip may be bonded while some of the solder bumps of the semiconductor chip are not in contact with corresponding solder bumps of the substrate. This causes a defect in a semiconductor chip bonding process. Further, when temperatures of the semiconductor chip and the substrate rise to bond the semiconductor chip to the substrate, the semiconductor chip or the substrate may be partially bent or warped due to a difference in coefficients of thermal expansion of materials. This also causes a defect in the semiconductor chip bonding process.

SUMMARY

One or more embodiments include a system for laser bonding of flip chip for effectively bonding a semiconductor chip, which may be bent or warped or a semiconductor chip that may be bent or warped due to a rise in temperature, to a substrate while preventing poor contact of solder bumps.

Additional aspects will be set forth in part in the description which follows and, in part, will be apparent from the description, or may be learned by practice of the presented embodiments.

According to one or more embodiments, a system for laser bonding of flip chip includes: a supply unit configured to supply a substrate, on which a plurality of semiconductor chips to be bonded to an upper surface of the substrate are arranged; a fixing unit configured to receive the substrate from the supply unit and fix a lower surface of the substrate; a laser unit including a laser head for bonding the semiconductor chips to the substrate by irradiating a laser beam to the substrate fixed to the fixing unit and a laser transporting portion transporting the laser head; a mask including a transmitting portion configured to transmit through a laser beam irradiated from the laser head of the laser unit and transmit through infrared rays including a wavelength band from about 3 μm or more to about 9 μm or less; a mask holding unit configured to hold the mask above the fixing unit; a pressurizing unit configured to lift one of the mask holding unit and the fixing unit relative to the other such that the transmitting portion of the mask pressurizes a plurality of semiconductor chips of the substrate fixed to the fixing unit; a discharging unit configured to receive the substrate from the fixing unit and discharge the substrate; an infrared camera configured to capture an image of the semiconductor chips to which a laser beam is irradiated by the laser head of the laser unit; and a controller configured to control operation of the supply unit, the fixing unit, and the discharging unit, and control operation of the laser head of the laser unit by using a value measured by the infrared camera.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a system for laser bonding of flip chip according to the present disclosure will be described with reference to the attached drawings.

Figure 1:
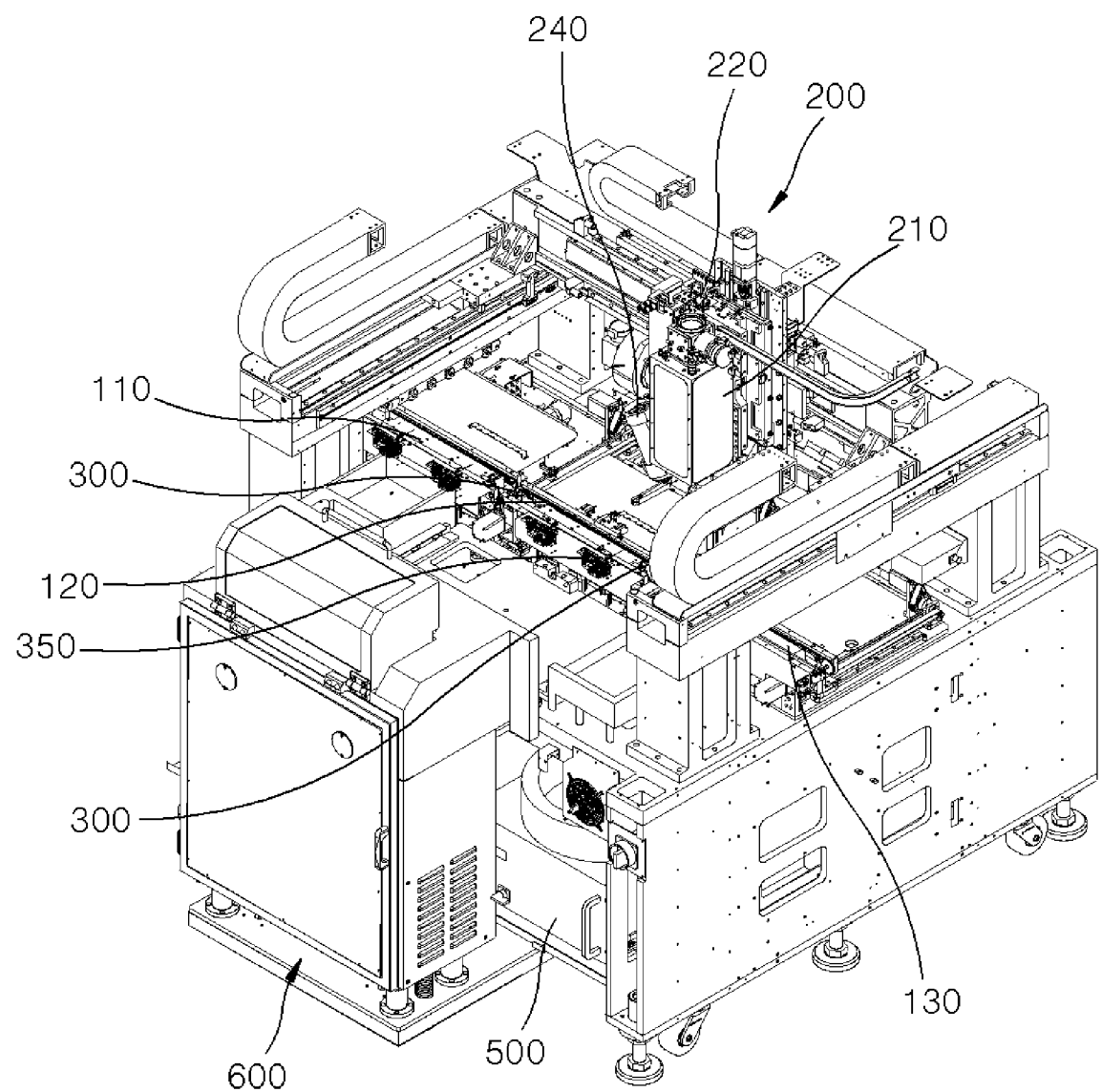
FIG. 1 is a perspective view of a system for laser bonding of flip chip according to an embodiment of the present disclosure.
Figure 2:
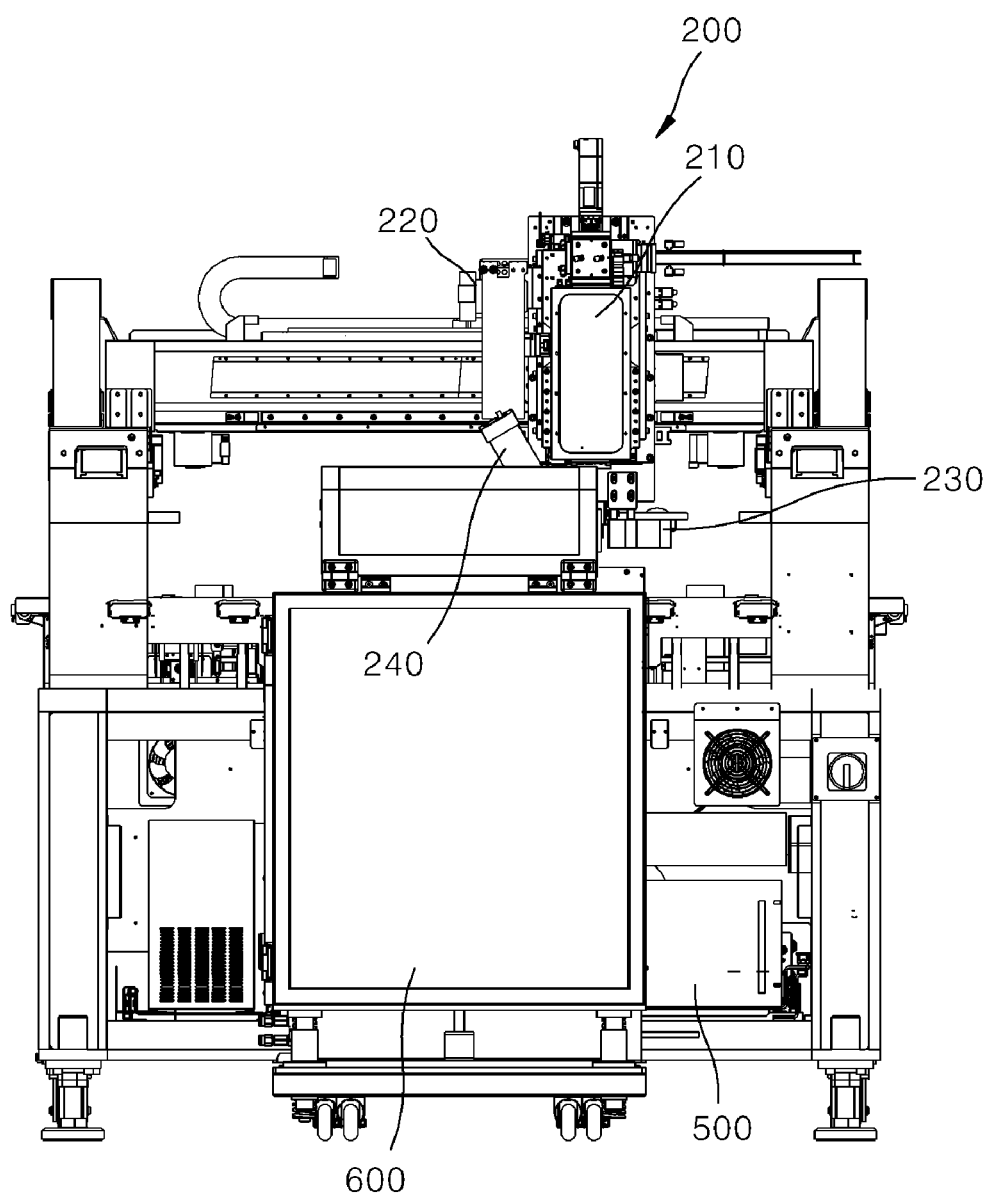
FIG. 2 is a front view of the system for laser bonding of flip chip illustrated in FIG. 1.

FIG. 1 is a perspective view of a system for laser bonding of flip chip according to an embodiment of the present disclosure. FIG. 2 is a front view of the system for laser bonding of flip chip illustrated in FIG. 1.

The system for laser bonding of flip chip according to the present embodiment is an apparatus for bonding a semiconductor chip to a substrate in the form of a flip chip by using a laser beam. Solder bumps are formed on any one of or both the substrate and the semiconductor chip, and the semiconductor chip is bonded to the substrate as the solder bumps are instantaneously melted by energy transferred via a laser beam and then solidified.

Referring to FIGS. 1 and 2, the system for laser bonding of flip chip according to the present embodiment includes a supply unit 110, a fixing unit 120, a laser unit 200, and a discharging unit 130.

The supply unit 110 is configured to supply a substrate for laser bonding to the fixing unit 120. A substrate on which a plurality of semiconductor chips are arranged is supplied. In general, a flux is coated on a substrate and a plurality of semiconductor chips are arranged thereon. The semiconductor chips are temporarily adhered to the substrate due to the viscosity or adhesive properties of the flux. Unless relatively large vibration or external impact is applied, the semiconductor chips on the substrate are not shaken by the flux but their positions with respect to the substrate are maintained.

The supply unit 110 sequentially supplies a plurality of substrates, to which semiconductor chips temporarily adhered as above, to the fixing unit 120. In the present embodiment, the supply unit 110 supplies substrates to the fixing unit 120 by using a belt supporting both sides of the substrates.

The fixing unit 120 also transports substrates received from the supply unit 110 to operation positions also by using the belt supporting both sides of the substrates. The fixing unit 120 fixes the substrate by adsorbing lower surfaces of the substrate.

The laser unit 200 is arranged above the fixing unit 120. The laser unit 200 includes a laser head 210 and a laser transporting portion 220. The laser head 210 irradiates a laser beam to the substrate fixed to the fixing unit 120 to transfer energy to the substrate. The laser transporting portion 220 transports the laser head 210 in a vertical direction and a horizontal direction. A controller 500 operates the laser unit 200 such that the laser head 210 irradiates a laser beam while sequentially moving above the semiconductor chips of the substrate fixed to the fixing unit 120.

Figure 3:
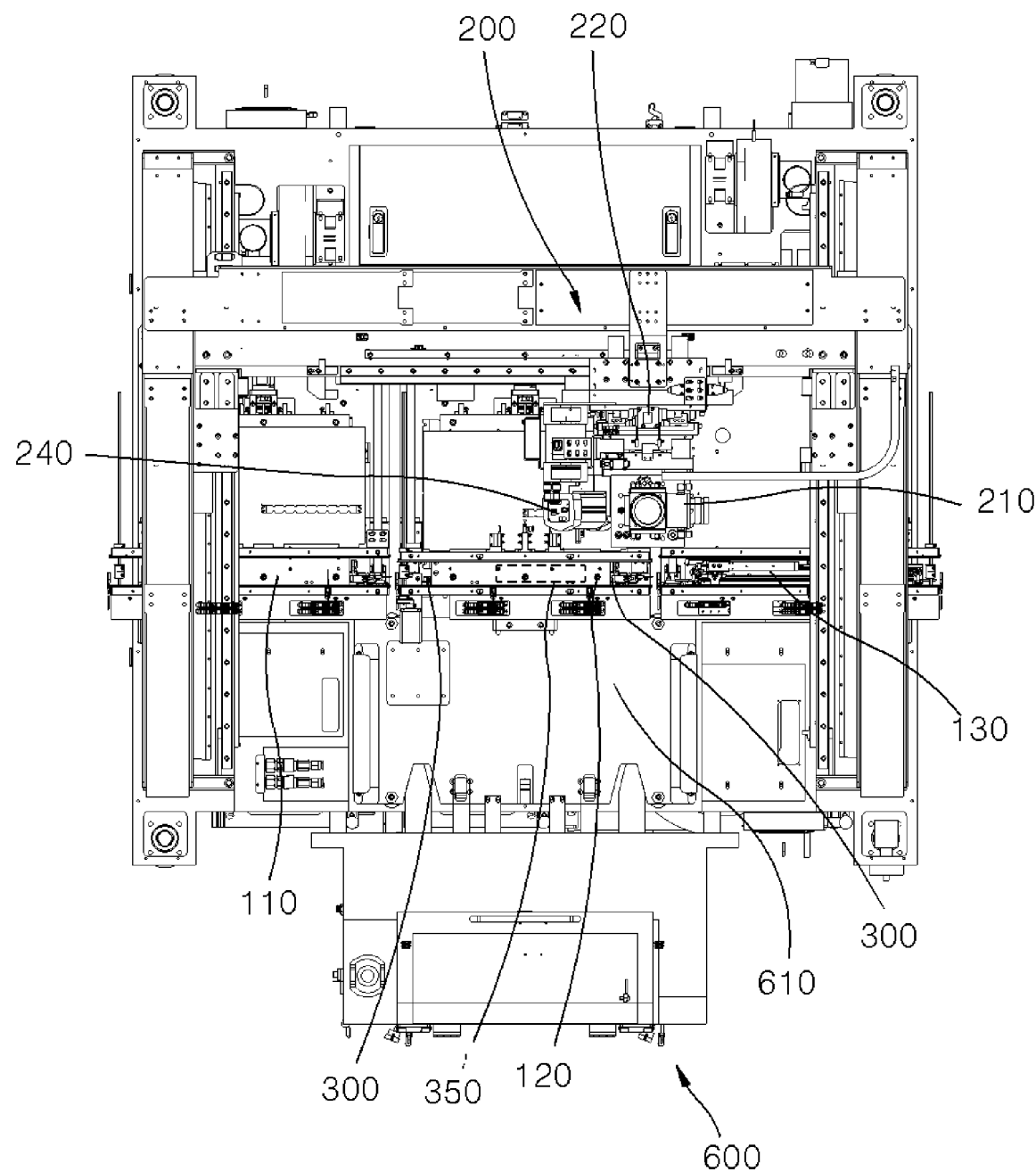
FIG. 3 is a plan view of a portion of the system for laser bonding of flip chip illustrated in FIG. 1.
Figure 4:
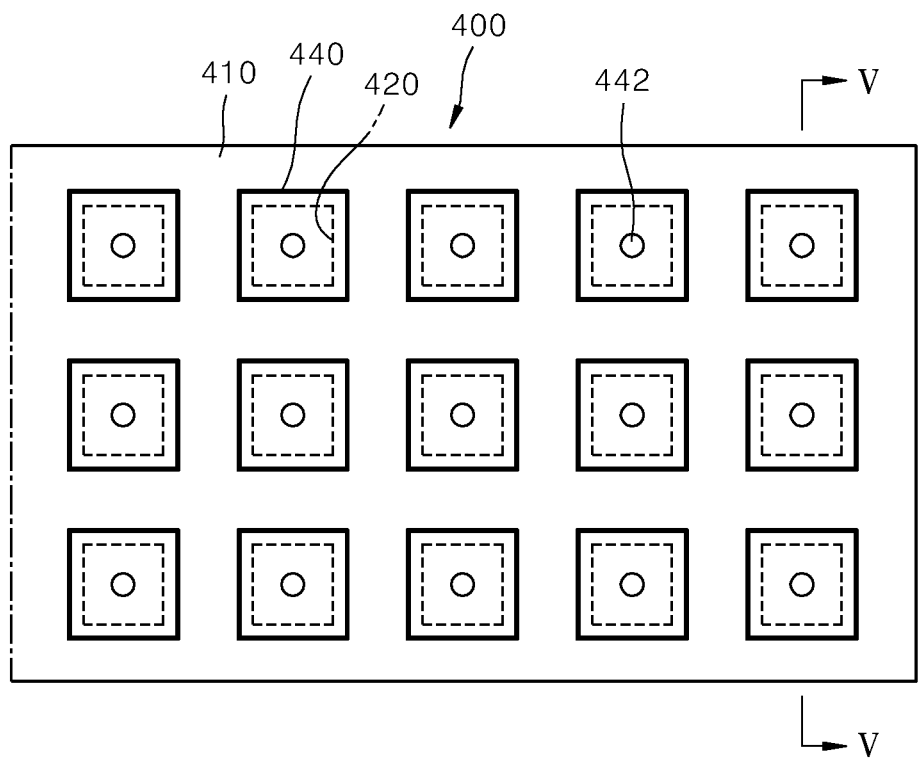
FIG. 4 is a top view of a mask used in the system for laser bonding of flip chip illustrated in FIG. 1.
Figure 5:
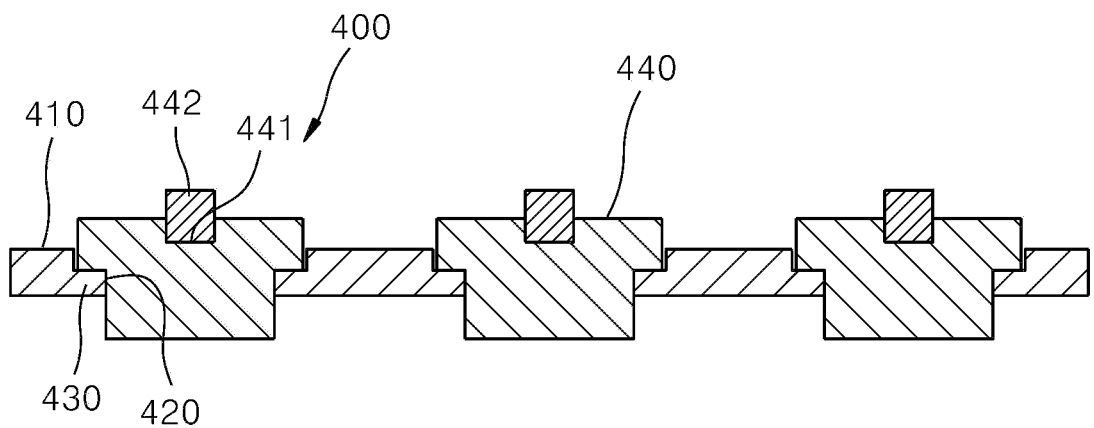
FIG. 5 is a cross-sectional view of the mask illustrated in FIG. 4.

FIG. 3 is a plan view of a portion of the system for laser bonding of flip chip illustrated in FIG. 1. FIG. 4 is a top view of a mask used in the system for laser bonding of flip chip illustrated in FIG. 1. FIG. 5 is a cross-sectional view of the mask illustrated in FIG. 4. A mask 400 shown in FIG. 4 and FIG. 5 is arranged above the fixing unit 120 shown in FIG. 3 to which the substrate is fixed. The mask 400 is supported by a mask holding unit 300. The mask 400 includes a transmitting portion 440 through which laser light may be transmitted. A laser beam irradiated from the laser head 210 passes through the transmitting portion 440 of the mask 400 to be transmitted to semiconductor chips therebelow. In the system for laser bonding of flip chip according to the present embodiment, the transmitting portion 440 may be formed of $BaF_2$. Unlike quartz which transmits through only visible rays and infrared rays in a short-wavelength range, $BaF_2$ is a transparent material that also transmits through infrared rays in a relatively long wavelength range. While quartz is a material that transmits through light having a wavelength from 0.18 μm to 3.5 μm, $BaF_2$ transmits through light having a wavelength in a range from 0.15 μm to 12 μm. A structure of the mask 400 will be described in detail later.

A pressurizing unit 350 is configured to lift up one of the mask holding unit 300 and the fixing unit 120 relative to the other to thereby pressurize semiconductor chips attached to a substrate by using the transmitting portion 440 of the mask 400. In the present embodiment, the pressurizing unit 350 lifts up the substrate. Referring to FIG. 2 and FIG. 3, the pressurizing unit 350 lifts up a configuration in which the fixing unit 120 adsorbs the lower surfaces of the substrates. When the pressurizing unit 350 lifts up the substrate while the mask 400 is held on the mask holding unit 300, the weight of the transmitting portion 440 of the mask 400 is transferred to the semiconductor chips to pressurize the semiconductor chips.

The discharging unit 130 receives substrates on which laser bonding of semiconductor chips is completed in the fixing unit 120 and discharges the substrates. Like the supply unit 110 and the fixing unit 120, the discharging unit 130 receives substrates from the fixing unit 120 by using the belt fixing both sides of the substrates and discharges the substrates to an unloader.

The controller 500 controls operations of major configurations according to the present disclosure, including the supply unit 110, the fixing unit 120, the laser unit 200, and the discharging unit 130.

An inspection camera 230 is arranged above the fixing unit 120. In the present embodiment, the inspection camera 230 is installed on the laser unit 200 and is moved together with the laser head 210 by the laser transporting portion 220. The inspection camera 230 is configured to capture an image of substrates or the mask 400 arranged therebebelow to allow the controller 500 to determine a position of semiconductor chips or whether the mask 400 is contaminated.

An inspection lamp 610 shown in FIG. 3 is arranged below the inspection camera 230 shown in FIG. 2. In the present embodiment, the inspection lamp 610 is installed on a mask changing unit 600 to be described below. The inspection lamp 610 is arranged downstream of a path through which the mask 400 is transported. The inspection lamp 610 irradiates light from below the mask 400. Light generated from the inspection lamp 610 may pass by the transmitting portion 440 of the mask 400 to be transferred to the inspection camera 230 thereabove. By using lighting of the inspection lamp 610, the inspection camera 230 may effectively capture an image of the transmitting portion 440 of the mask 400. The controller 500 that has received the image captured by the inspection camera 230 inspects whether the transmitting portion 440 of the mask 400 is contaminated and inspects whether the mask 400 needs to be changed.

Referring to FIG. 3, an infrared camera 240 is installed above the fixing unit 120. The infrared camera 240 captures an image of semiconductor chips of substrate fixed to the fixing unit 120. A temperature of the semiconductor chips rises during melting of solder bumps irradiated with a laser beam. In general, the temperature of the semiconductor chips varies between 50° C. to 500° C. According to Wien's displacement law, a wavelength of infrared rays emitted from a semiconductor chip, which changes between 50° C. and 500° C., is approximately 3 μm or more and 9 μm or less. When the mask 400 is arranged above a substrate, an image of a semiconductor chip is captured through the transmitting portion 440 of the mask 400. As described above, as the transmitting portion 440 of the mask 400 according to the present embodiment is formed of $BaF_2$, light having a wavelength of about 0.15 μm to about 12 μm is transmitted. That is, the transmitting portion 440 not only transmits through all of laser light generated from the laser head 210 but also transmits through all infrared rays having a wavelength of about 3 μm to about 9 μm. Accordingly, the infrared camera 240 may capture an image of the semiconductor chip through the transmitting portion 440 while heating the semiconductor chip by irradiating a laser beam to the semiconductor chip arranged below the transmitting portion 440. That is, the infrared camera 240 may accurately measure the temperature of the semiconductor chip that varies between 50° C. and 500° C. through the transmitting portion 440. The actual temperature at which a semiconductor chip is heated is often from 200° C. to 400° C., the temperature may be checked while heating the semiconductor chip with laser by using the transmitting portion 440 which may transmits through a laser beam and also infrared rays in the above temperature range. In this case, a wavelength of infrared rays corresponding to 200° C. to 400° C. corresponds to approximately 4 µm to 6 µm. As described above, $BaF_2$ also transmits through a laser beam and also infrared rays in the same wavelength band, and thus may be used as a material of the transmitting portion 440.

The controller 500 may determine a temperature for each region of the semiconductor chip by using a value obtained by image capturing by the infrared camera 240. The controller 500 controls operation of the laser head 210 of the laser unit 200 by using a value measured by the infrared camera 240.

Referring to FIG. 1 and FIG. 2, the mask changing unit 600 is configured to accommodate a plurality of masks 400 and change the mask 400 held on the mask holding unit 300 as necessary. The controller 500 transmits a command to change the mask 400 to the mask changing unit 600 according to necessity, and the mask changing unit 600 changes the mask 400 held on the mask holding unit 300 to a new mask 400. As described above, as the inspection lamp 610 is installed on the mask changing unit 600, whether the mask 400 to be changed is contaminated is inspected while the mask 400 is disposed above the inspection lamp 610. When it is determined that, as a result of inspecting the image captured by the inspection camera 230, by the controller 500, the mask 400 is not contaminated, the mask 400 is transferred back to the mask holding unit 300. When the controller 500 determines that the mask 400 is contaminated, the contaminated mask 400 is accommodated in the mask changing unit 600, and a new mask 400 is drawn out and transferred to the mask holding unit 300.

Hereinafter, a structure of the mask 400 will be described with reference to FIGS. 4 and 5.

The mask 400 used in the present embodiment includes a mask body 410, a plurality of transmission holes 420, and the transmitting portion 440.

The mask body 410 is formed in a flat plate shape. The mask body 410 is manufactured in a form corresponding to that of a substrate and in a similar size to a substrate considering the size of the substrate.

The plurality of transmission holes 420 are formed in the mask body 410. The transmission holes 420 are respectively formed at positions corresponding to positions of semiconductor chips of a substrate to be arranged below the mask 400. The transmission holes 420 are manufactured in a similar size and shape to a size and shape of the semiconductor chips. In the present embodiment, the mask body 410 including the transmission holes 420 formed to be slightly larger than the size of the semiconductor chips is used.

A holding protrusion 430 which protrudes inwardly is formed in each of the transmission holes 420. In the present embodiment, as illustrated in FIG. 4, the holding protrusion 430 is formed in a form corresponding to the transmission holes 420. The form of the holding protrusion 430 may also be in other various forms than that illustrated in FIG. 4.

Referring to FIG. 5, the transmitting portion 440 is inserted into each of the transmission holes 420. Here, a lower portion of the transmitting portion 440 is formed to be held by the holding protrusion 430. A lower surface of the transmitting portion 440 is formed in a form of a flat surface.

When the transmitting portion 440 pressurizes the semiconductor chips on the substrate by the operation of the pressurizing unit 350, the semiconductor chips are uniformly and flatly pressed by the transmitting portion 440 having a flat lower surface. The transmitting portion 440 is formed of a transparent material through which a laser beam may penetrate. As described above, in the present embodiment, the transmitting portion 440 is formed of $BaF_2$. The mask body 410 is formed of an opaque material through which a laser beam does not penetrate. The mask body 410 has a function of preventing a laser beam from passing through regions except for the transmitting portion 440.

In the present embodiment, a weight groove 441 which is concavely formed is formed on an upper surface of the transmitting portion 440. A weight 442 is arranged in each of the weight grooves 441. The weight 442 has a function of further increasing a force for pressurizing the semiconductor chips via the transmitting portion 440.

Hereinafter, operation of the system for laser bonding of flip chip according to the present embodiment configured as described above will be described.

First, a substrate on which semiconductor chips are arranged is prepared. The supply unit 110 sequentially supplies substrates, on which the semiconductor chips are arranged by temporarily bonding, to the substrates, the semiconductor chips having solder bumps formed on lower surfaces thereof and coated with a flux, as described above. The supply unit 110 supplies the substrates to the fixing unit 120. The fixing unit 120 receives and fixes the substrates by adsorbing lower surfaces of the substrates.

In this state, the laser transporting portion 220 of the laser unit 200 captures an image of the semiconductor chips of the substrates while moving the inspection camera 230 above the substrates. The controller 500 identifies locations of the semiconductor chips by using the image received from the inspection camera 230.

Next, the mask changing unit 600 transports the mask 400 to be above the fixing unit 120. The mask holding unit 300 receives the mask 400 and places the same above the substrates.

In this state, the pressurizing unit 350 lifts up the substrate fixed to the fixing unit 120.

When the substrate is lifted up by the pressurizing unit 350, each of the semiconductor chips of the substrate come into contact with the lower surface of the transmitting portion 440 of the mask 400. When the pressurizing unit 350 continues to lift up the substrate, the respective semiconductor chips lift the transmitting portion 440 with respect to the mask body 410. As described above, as the transmitting portion 440 is held on the holding protrusion 430 of the mask body 410, when the semiconductor chips are continuously lifted, the transmitting portion 440 is lifted upward by the semiconductor chips. That is, while the mask body 410 is in a stationary state, only the transmitting portion 440 is lifted upwards. As a result, a load of the transmitting portion 440 is transferred to each semiconductor chip to flatly press upper surfaces of the semiconductor chips. Here, when the weight 442 is arranged in the weight groove 441 of the transmitting portion 440 as described above, the magnitude of the force pressurizing the semiconductor chips increases by the weight of the weight 442.

In this state, the controller 500 operates the laser unit 200 to sequentially bond the semiconductor chips of the substrate. When the laser transporting portion 220 sequentially arranges the laser head 210 above each semiconductor chip and the laser head 210 irradiates a laser beam to each semiconductor chip, the semiconductor chips are bonded to the substrate. The laser beam is transmitted to the solder bumps through the transmitting portion 440 and a body of the semiconductor chips, and increase temperature of the solder bumps to thereby adhere the solder bumps to pads of the substrate.

As the laser beam instantaneously increases the temperature of the solder bumps, there is an advantage in not increasing the temperature of the semiconductor chips themselves more than necessary. Accordingly, the laser beam completes the bonding operation of the solder bumps in a relatively short time, and thus, the semiconductor chips are not heated to a high temperature for a long period of time. Here, even when the semiconductor chips are twisted or thermally deformed, as the transmitting portion 440 of the mask 400 pressurizes the upper surfaces of the semiconductor chips, twisting or bending of the semiconductor chips may be prevented. By preventing bending of the semiconductor chips as above, a defect caused by some of the solder bumps of the semiconductor chips, which are not bonded to the substrate, may be prevented.

As described above, a laser beam may pass through only the transmitting portion 440 of the mask 400 and does not pass through the mask body 410, and thus, a laser beam irradiated from the laser head 210 is only transmitted to the semiconductor chips. As described above, by using the mask 400 including the transmitting portion 440 and the mask body 410, irradiation of a laser beam to portions of the substrate to which energy of the laser beam does not need to be transmitted may be prevented.

Also, a plurality of semiconductor chips may be bonded to a substrate. By manipulating the laser head 210 to increase an irradiation area of the laser beam, two or more semiconductor chips may be simultaneously irradiated with the laser beam. A laser beam cannot pass through the mask body 410 of the mask 400, and thus, even when the laser beam is irradiated over a relatively wide area, it is possible to transmit the energy of the laser beam only to those semiconductor chips which are required to be bonded. By simultaneously bonding a plurality of semiconductor chips to a substrate according to the above-described method, the overall process productivity may be increased. According to circumstances, all semiconductor chips may be simultaneously bonded to a substrate by irradiating a laser beam to the entire mask 400.

Meanwhile, a region in which the weight groove 441 and the weight 442 of the transmitting portion 440 are arranged is formed in a region in which the solder bumps of the semiconductor chips are not formed. In the present embodiment, as there is no solder bump in a center portion of the semiconductor chips, but only at edge portions of the semiconductor chips, the weight groove 441 and the weight 442 are arranged in a center portion of the transmitting portion 440, as illustrated in the drawing.

Substrates on which bonding is completed through the process as described above are transferred from the fixing unit 120 to the discharging unit 130. The discharging unit 130 receives the substrate and transfers the same to the unloader.

The controller 500 operates the mask changing unit 600 to inspect contamination of the mask 400 or change the mask 400 when the number of times of using the mask 400 exceeds a certain number of times.

For example, after using the mask 400 twenty times, the controller 500 transports, by using the mask changing unit 600, the mask 400 from the mask holding unit 300 to be above the inspection lamp 610. In this state, the controller 500 turns on the inspection lamp 610, and captures an image of the mask 400 by the inspection camera 230. When dust particles or the like due to contamination of the transmitting portion 440 are found in the captured image of the mask 400, the controller 500 operates the mask changing unit 600 to change the mask 400. The mask changing unit 600 replaces the contaminated mask 400 and transfers a new mask 400 to the mask holding unit 300 to hold the new mask 400. As a result of inspection by the controller 500, when it is determined that the mask 400 is not contaminated, the mask 400 located above the inspection lamp 610 is transferred back to the mask holding unit 300 to be reused.

Meanwhile, the system for laser bonding of flip chip according to the present embodiment may measure a change in a temperature of the semiconductor chips in real time while the transmitting portion 440 of the mask 400 is pressurizing the upper surface of the semiconductor chips. According to the related art, a transmitting portion is configured with quartz, which is a typical transparent material. When measuring temperature through quartz by using an infrared camera, the temperature range below 500° C. is not measured. This is because, as described above, quartz cannot transmit through infrared rays having a wavelength of 3.5 µm or more. In the system for laser bonding of flip chip according to the present embodiment, the transmitting portion 440 is formed of $BaF_2$. $BaF_2$ may transmit through light having a wavelength of 0.15 µm to 12 µm. That is, the transmitting portion 440 may transmit all infrared rays emitted from a material having a temperature between 50° C. and 500° C. Thus, the infrared camera 240 may accurately measure the temperature of the semiconductor chips through the transmitting portion 440 even when the transmitting portion 440 pressurizes the upper surface of the semiconductor chips. Accordingly, while heating the semiconductor chips by irradiating a laser beam through the transmitting portion 440, the temperature of the semiconductor chips may be simultaneously measured using the infrared camera 240.

The controller 500 may measure the temperature of the semiconductor chips in real time by using the infrared camera 240 and control the operation of the laser head 210 by reflecting the temperature. While the laser beam is irradiated to the semiconductor chips, the infrared camera 240 measures the temperature of the semiconductor chips through the transmitting portion 440 of the mask 400. While solder bumps melt due to irradiation of a laser beam, the temperature of semiconductor chips adjacent to the solder bumps also increases. That is, the infrared camera 240 indirectly measures the temperature of the solder bumps from the temperature of the semiconductor chips. The controller 500 controls operation of the laser head 210 in real time by receiving temperature information of the semiconductor chips, measured by the infrared camera 240. A laser beam may be desirably irradiated to a plurality of solder bumps uniformly between a semiconductor chip and a substrate. That is, a uniform increase in temperature of the solder bumps is desirable. The infrared camera 240 measures a temperature of a surface of the semiconductor chips. The controller 500 controls operation of the laser head 210 such that a laser beam with a relatively high intensity is irradiated to a portion of the semiconductor chips, the portion having a relatively low surface temperature. As described above, as the controller 500 controls the laser head 210, temperature of all solder bumps may be increased uniformly. This means that a laser beam is uniformly irradiated to all solder bumps. According to the present disclosure, whether the upper surfaces of the semiconductor chips are uniformly heated using the transmitting portion 440 which transmits through infrared rays of a broad band may be determined by using the infrared camera 240 in real time. As a result, according to the present disclosure, intensity of a laser beam may be uniformly controlled according to locations.

While the present disclosure has been described with reference to preferred embodiments, the scope of the present disclosure is not limited to the above described and illustrated forms.

For example, while the transmitting portion 440 of the mask 400 formed of $BaF_2$, the transmitting portion of the mask may also be formed of other transparent materials. As described above, in a laser beam irradiation operation, the temperature of semiconductor chips varies between 50° C. and 500° C. Here, a wavelength of infrared rays irradiated to the semiconductor chips is from about 3 μm to about 9 μm. Accordingly, the transmitting portion may be formed of various materials that transmit through infrared rays having a wavelength from about 3 μm to about 9 μm. For example, the transmitting portion may be formed of a material such as ZnSe. ZnSe transmits through infrared rays having a wavelength from 0.6 μm to 16 μm. The transmitting portion may also be formed of a material such as Ge, which transmits through infrared rays having a wavelength of 2 μm to 16 μm.

Also, according to circumstances, a mask may be formed of a transmitting portion transmitting through infrared rays having a wavelength from 4 μm to 6.5 μm. Examples of the above material include $CaF_2$ or $MgF_2$.

Also, the transmitting portion on which non-reflective coating is applied may be used. When configuring a transmitting portion by using a material that easily transmits through infrared rays according to the purpose of the present disclosure, a transmittance of a laser beam may be reduced according to the material of the transmitting portion. In this case, non-reflective coating may be applied to the transmitting portion to reduce reflection of a laser beam. By applying non-reflective coating on the transmitting portion as above, a transmitting portion which easily transmits through both a laser beam for heating semiconductor chips and infrared rays for measuring a temperature of the semiconductor chips according to the purpose of the present disclosure may be configured.

Also, while it is described above that a pressurizing member lifts up the substrate, the semiconductor chips may also be pressurized by the pressurizing member lowering the mask 400.

Also, while the transmitting portion 440 of the mask 400, on which the weight groove 441 is formed and the weight 442 is arranged, is described above, the mask 400 having a structure without the weight groove 441 and the weight 442 may also be used. According to circumstances, a mask including a transmitting portion including only a weight groove and a weight may also be used.

In addition, while the system for laser bonding of flip chip including the mask changing unit 600 is described above as an example, a system for laser bonding of flip chip having a structure without the mask changing unit 600 may also be configured. In this case, the mask 400 may be continuously used without inspecting whether the mask 400 is contaminated, or the system for laser bonding of flip chip may be configured such that the mask 400 is replaced manually.

In addition, a system for laser bonding of flip chip having a structure without the infrared camera 240, the inspection lamp 610, the inspection camera 230 or the like may also be configured.

According to the system for laser bonding of flip chip of the present disclosure, by performing laser bonding on a substrate while pressurizing semiconductor chips, even semiconductor chips which are bent or likely to bend may be bonded to the substrate without causing poor contact of solder bumps.

While the present disclosure has been described with reference to preferred embodiments, the scope of the present disclosure is not limited to the above described and illustrated structures.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A system for laser bonding of flip chip comprising:
a supply unit configured to supply a substrate, on which a plurality of semiconductor chips to be bonded to an upper surface of the substrate are arranged;
a fixing unit configured to receive the substrate from the supply unit and fix a lower surface of the substrate;
a laser unit comprising a laser head for bonding the semiconductor chips to the substrate by irradiating a laser beam to the substrate fixed to the fixing unit and a laser transporting portion transporting the laser head;
a mask comprising a transmitting portion configured to transmit through a laser beam irradiated from the laser head of the laser unit and transmit through infrared rays including a wavelength band from about 3 μm or more to about 9 μm or less;
a mask holding unit configured to hold the mask above the fixing unit;
a pressurizing unit configured to lift one of the mask holding unit and the fixing unit relative to the other such that the transmitting portion of the mask pressurizes a plurality of semiconductor chips of the substrate fixed to the fixing unit;
a discharging unit configured to receive the substrate from the fixing unit and discharge the substrate;
an infrared camera configured to capture an image of the semiconductor chips to which a laser beam is irradiated by the laser head of the laser unit; and
a controller configured to control operation of the supply unit, the fixing unit, and the discharging unit, and control operation of the laser head of the laser unit by using a value measured by the infrared camera.

2. The system for laser bonding of flip chip of claim 1, wherein the transmitting portion of the mask transmits through infrared rays in a wavelength band from about 4 μm or more and 6.5 μm or less.

3. The system for laser bonding of flip chip of claim 1, wherein the infrared camera captures an image of the semiconductor chips when a laser beam is irradiated to the semiconductor chips by the laser head of the laser unit, and the controller receives the value measured by the infrared camera and adjusts an intensity of the laser beam irradiated from the laser head of the laser unit.

4. The system for laser bonding of flip chip of claim 3, further comprising a mask changing unit configured to supply the mask to the mask holding unit or discharge the mask.

5. The system for laser bonding of flip chip of claim 3, further comprising:
an inspection lamp irradiating light to the mask from below the mask; and
an inspection camera capturing an image of the mask or the substrate from above,
wherein the controller determines whether the mask is contaminated, by using the image of the mask captured by the inspection camera.

6. The system for laser bonding of flip chip of claim 3, wherein the inspection lamp is installed on the mask changing unit, and the inspection camera is installed on the laser unit and transported by the laser transporting portion.

7. The system for laser bonding of flip chip of claim 3, wherein a weight groove that is concave is formed in an upper surface of each of the plurality of transmissions portions of the mask, and
the mask further comprises a weight that is held in the weight groove of the transmitting portions to increase a weight whereby the plurality of semiconductor chips arranged on the substrate are pressurized.

8. The system for laser bonding of flip chip of claim 3, wherein non-reflective coating is applied to the transmitting portion of the mask.

9. A system for laser bonding of flip chip comprising:
a supply unit configured to supply a substrate, on which a plurality of semiconductor chips to be bonded to an upper surface of the substrate are arranged;
a fixing unit configured to receive the substrate from the supply unit and fix a lower surface of the substrate;
a laser unit comprising a laser head for bonding the semiconductor chips to the substrate by irradiating a laser beam to the substrate fixed to the fixing unit and a laser transporting portion transporting the laser head;
a mask comprising a transmitting portion which is configured to transmit through a laser beam irradiated from the laser head of the laser unit and is formed of one of $BaF_2$ and ZnSe;
a mask holding unit configured to hold the mask above the fixing unit;
a pressurizing unit configured to lift one of the mask holding unit and the fixing unit relative to the other such that the transmitting portion of the mask pressurizes the plurality of semiconductor chips of the substrate fixed to the fixing unit;
a discharging unit configured to receive the substrate from the fixing unit and discharge the substrate;
an infrared camera configured to capture an image of the semiconductor chips to which a laser beam is irradiated by the laser head of the laser unit; and
a controller configured to control operation of the supply unit, the fixing unit, and the discharging unit, and control operation of the laser head of the laser unit by using values measured by the infrared camera.

10. The system for laser bonding of flip chip of claim 9, wherein the infrared camera captures an image of the semiconductor chips when a laser beam is irradiated to the semiconductor chips by the laser head of the laser unit, and
the controller receives the value measured by the infrared camera and adjusts an intensity of the laser beam irradiated from the laser head of the laser unit.

11. The system for laser bonding of flip chip of claim 10, further comprising a mask changing unit configured to supply the mask to the mask holding unit or discharge the mask.

12. The system for laser bonding of flip chip of claim 10, further comprising:
an inspection lamp irradiating light to the mask from below the mask; and
an inspection camera capturing an image of the mask or the substrate from above,
wherein the controller determines whether the mask is contaminated, by using the image of the mask captured by the inspection camera.

13. The system for laser bonding of flip chip of claim 10, wherein the inspection lamp is installed on the mask changing unit, and the inspection camera is installed on the laser unit and transported by the laser transporting portion.

14. The system for laser bonding of flip chip of claim 10, wherein a weight groove that is concave is formed in an upper surface of each of the plurality of transmissions portions of the mask, and
the mask further comprises a weight that is held in the weight groove of the transmitting portions to increase a weight whereby the plurality of semiconductor chips arranged on the substrate are pressurized.

15. The system for laser bonding of flip chip of claim 10, wherein non-reflective coating is applied to the transmitting portion of the mask.

* * * * *